United States Patent [19]
Dong

[11] Patent Number: 5,267,249
[45] Date of Patent: Nov. 30, 1993

[54] DEVICE AND METHOD FOR ASYNCHRONOUS CYCLIC REDUNDANCY CHECKING FOR DIGITAL RECEIVERS

[75] Inventor: Ping Dong, No. Quincy, Mass.

[73] Assignee: Codex Corporation, Mansfield, Mass.

[21] Appl. No.: 698,010

[22] Filed: May 9, 1991

[51] Int. Cl.$^5$ .................. H03M 13/00; H04J 3/06
[52] U.S. Cl. .................. 371/42; 370/105.1; 371/53
[58] Field of Search .............. 371/42, 49.2, 53, 54; 370/100.1, 105.1

[56] References Cited

U.S. PATENT DOCUMENTS

| | | | |
|---|---|---|---|
| 3,336,467 | 8/1967 | Frey | 371/42 |
| 3,577,146 | 5/1971 | Mitchell | 342/458 |
| 4,316,284 | 2/1982 | Howson | 370/105 |
| 4,316,285 | 2/1982 | Bobilin et al. | 370/105 |
| 4,412,329 | 10/1983 | Yarborough, Jr. | 371/47.1 |
| 4,425,645 | 1/1984 | Weaver et al. | 371/47.1 |
| 4,701,939 | 10/1987 | Stutt et al. | 375/115 |
| 4,729,123 | 3/1988 | Wheen | 370/100 |
| 4,807,230 | 2/1989 | Srinivasagopalan et al. | 371/46 |

OTHER PUBLICATIONS

Ramabadran, T. et al., "A Tutorial on CRC Computations", *IEEE Micro*, Aug. 1988, pp. 62-74.

"Broadband ISDN and Asynchronous Transfer Mode (ATM)," by Steven E. Minzer, 0163-6804/89/00-09-0017 IEEE, Sep. 1989 IEEE Communications Magazine.

*Primary Examiner*—Stephen M. Baker
*Attorney, Agent, or Firm*—Darleen J. Stockley

[57] ABSTRACT

A device and method for asynchronous cyclic redundancy checking (CRC) for digital receivers includes utilizing a finite impulse response (FIR) filter, and comparing and gating circuits. The FIR filter may contain a first multiple delay system unit (102) and a first logic gating system (104). The comparing and gating circuit may contain a second multiple delay system unit (106), and a second logic gating system (110). The device and method is implementable, where desired, utilizing a computer program. The invention provides a faster determination of a CRC frame synchronization on a received digital signal.

23 Claims, 5 Drawing Sheets

200

DEVICE AND METHOD FOR ASYNCHRONOUS CYCLIC REDUNDANCY CHECKING FOR DIGITAL RECEIVERS

FIELD OF THE INVENTION

This invention relates generally to digital receivers and, more particularly, to a circuit arrangement and method for resynchronizing the receiver with an incoming digital signal.

BACKGROUND OF THE INVENTION

Digital communication and information transmission systems require synchronization of a receiver with an incoming digital signal. In carrier systems, information in the incoming signal is typically transmitted in frames using coded segments, each coded segment being a fixed length data segment followed by a cyclic redundancy check (CRC). Random bits generally precede and follow each coded segment. Frames typically are identified by at least one of: certain framing bit patterns and correct cyclic redundancy checking. Identification of frames allows synchronization of incoming data information.

Synchronization of frames of data from incoming digital signals has typically been achieved by comparing received time division bits with a predetermined frame synchronization bit pattern. Detection of a predetermined number of framing errors initiates a reframing process that is iterated until synchronization is achieved. Such synchronization generally requires a large number of reframing iterations and comparisons. There is a need to reduce the time needed for frame synchronization to provide expedited receiver synchronization.

SUMMARY OF THE INVENTION

A cyclic redundancy checking (CRC) device and method are provided for a digital receiver framing synchronization determination of a received time division multiplexed signal having bits, which does not require periodic reset. The CRC device utilizes at least a finite impulse response filter.

The CRC device may be of a form suitable for use with a digital computer wherein the CRC device comprises a computer program medium having a computer program to be executed by the digital computer stored thereon, the computer program comprising at least a first unit for processing a received time division multiplexed signal, the signal including at least a first fixed length data bit segment followed by a cyclic redundancy check bit segment; and a second unit for generating a frame synchronization output for each at least first fixed length data bit segment followed by a cyclic redundancy check bit segment.

DETAILED DESCRIPTION OF A PREFERRED EMBODIMENT

Generally a cyclic redundancy checking (CRC) code segment has a predetermined length n and contains predetermined k bits information, designated as a (n,k) code. A remaining $m = n - k$ bits, referred to as parity check bits, are generated according to a generating polynomial $g(x)$ of degree m. A natural length of the CRC code is $n_o$, and $n_o$ is greater than or equal to n.

Figure 1:
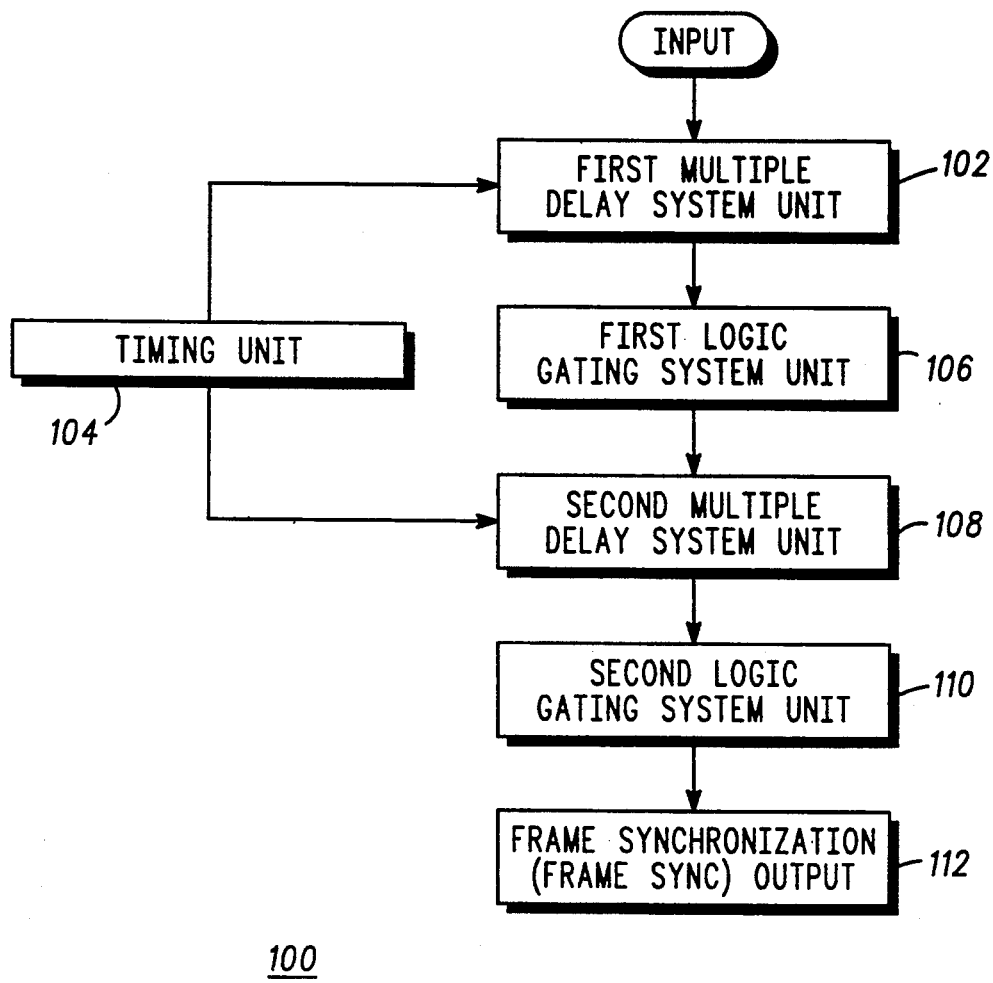
FIG. 1 is a block diagram of a first embodiment of a cyclic redundancy checking (CRC) device for digital receiver frame synchronization determination of a time division multiplexed signal in accordance with the present invention.

FIG. 1, numeral 100, is a block diagram of a first embodiment of a non-feedback cyclic redundancy checking (CRC) device for digital receiver frame synchronization determination of a time division multiplexed signal in accordance with the present invention. The cyclic redundancy checking (CRC) device provides for a digital receiver framing synchronization determination of a received time division multiplexed signal having bits, and utilizes at least a finite impulse response (FIR) filter such that periodic reset is not required. The cyclic redundancy checking device may also utilize a finite impulse response filter in a transposed form, an example of which is set forth in FIG. 8, described more fully below.

The non-feedback cyclic redundancy checking device for a digital receiver framing synchronization determination of a received time division multiplexed signal having bits, includes at least a first muliple delay system unit (102) responsive to the bits of the received time division multiplexed signal and a timing unit (104), typically a clock pulse generator, for generating a predetermined number of first selectively delayed bits. The first multiple delay system unit (102) provides for a predetermined number of substantially uniform multiple delays of at least k+1 bits and may range up to n bits depending on the CRC code being used.

Figure 2:
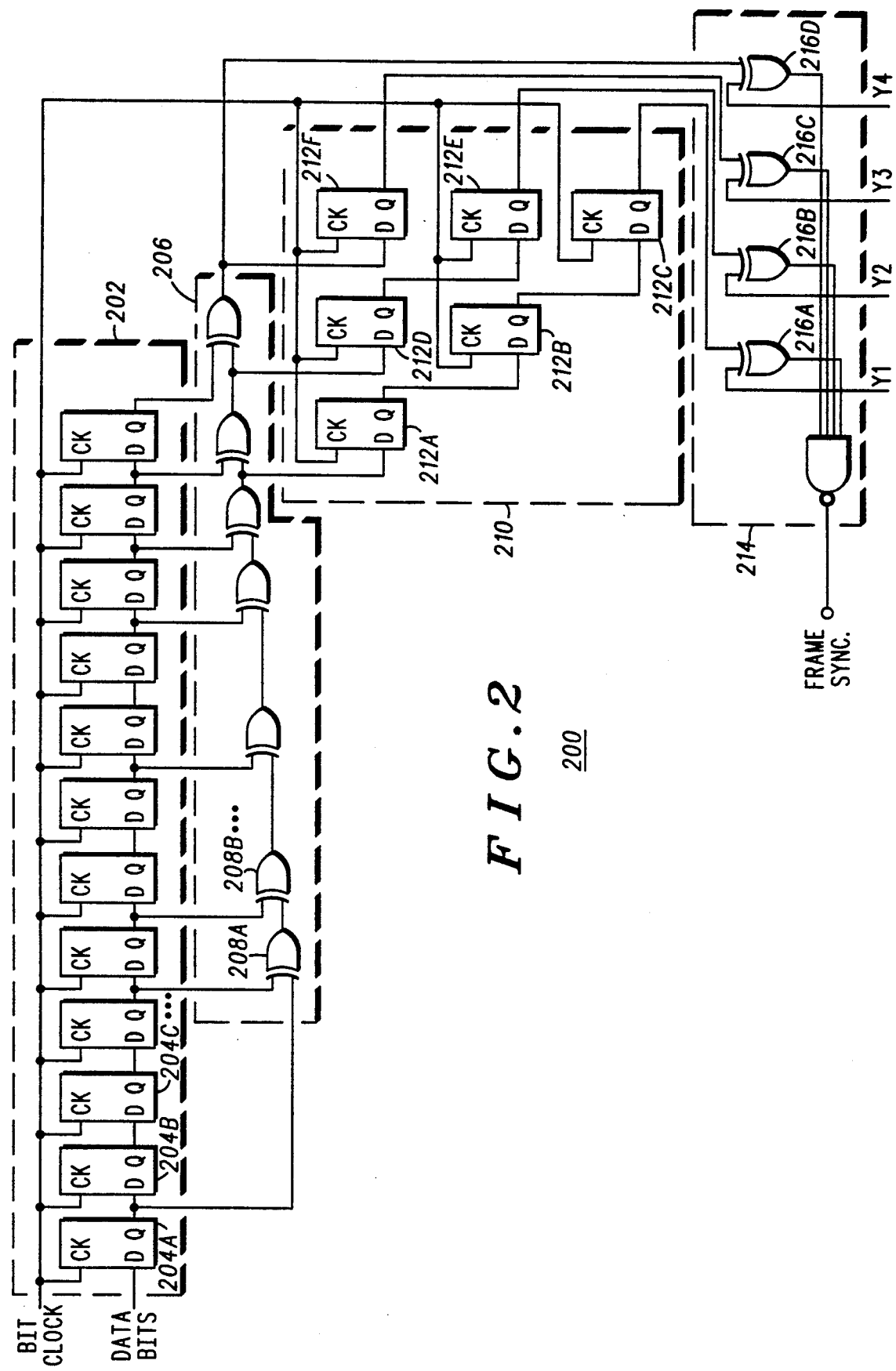
FIG. 2 illustrates an exemplary hardware embodiment of a CRC device for digital receiver frame synchronization determination of a time division multiplexed signal in accordance with the present invention.

In an exemplary hardware embodiment, FIG. 2, numeral 200, that implements a moderately shortened (13,9) CRC code with generating polynomial $g(x)=x^4+x+1$, where $n_o>n$ and $n_0-n<m$, the first multiple delay system unit typically includes at least a first substantially uniform multiple delay circuit responsive to the bits of the received time division multiplexed signal and to a timing device. Flip-flops (204A, 204B, ...) typically are utilized for delay units.

A first logic gating system unit (106) responsive to at least the first selectively delayed bits for processing selected first selectively delayed bits in accordance with a predetermined logic is utilized to multiply each consecutive first selectively delayed bit by a consecutive h(x) parity check polynomial coefficient that starts and decreases consecutively from a highest coefficient, $h_{n\theta-m}$, to a lowest coefficient, to provide processed selected first selectively delayed bits.

A second multiple delay system unit (108) responsive to the processed selected first selectively delayed bits is typically utilized to generate a predetermined number of second selectively delayed bits, substantially m−1.

In the exemplary hardware embodiment, FIG. 2, numeral 200, the substantially uniform first multiple delay system unit (202) is tapped off, and the first logic gating system unit (206) responsive to at least selected first selectively delayed bits is utilized to multiply each selected consecutive first selectively delayed bit by a consecutive h(x) parity check polynomial coefficient. The first logic gating system unit (206) typically includes at least first selected exclusive-OR (XOR) logic gates (208A, 208B, ...) for processing predetermined first selectively delayed bits in accordance with XOR logic.

A second multiple delay system unit (108) responsive to the processed selected first selectively delayed bits is utilized for generating a predetermined number of second selectively delayed bits. The second multiple delay system unit (108) includes at least selected flip-flop delay systems for latching, as desired, selected processed predetermined first selectively delayed bits multiplied by h(x) coefficients in accordance with XOR logic. The selected flip-flop systems for latching comprise, in parallel, a selected series of serially operably connected latches, a number of serially connected latches being substantially equal to a desired number of delays and the number of delays for each sequential selected series being sequentially selected from a range of delays from m-1 to zero delays.

In the exemplary hardware embodiment, FIG. 2, numeral 200, the second multiple delay system unit (210) comprises a first selected delay system (212A, 212B, 212C) provides three sequential delays for determining a first selected processed predetermined first selectively delayed bit, a second selected delay system (212D, 212E) provides two sequential delays for determining a second selected processed predetermined first selectively delayed bit, and a third selected delay system (212F) for determining a third selected processed predetermined first selectively delayed bit.

A second logic gating system unit (110) responsive to at least some of: selected second selectively delayed bits, selected processed first selectively delayed bits, predetermined reference input bits, and the timing unit (104) is utilized for comparing second selectively delayed bits and selected processed selected first selectively delayed bits with predetermined reference input bits. The second logic gating system means includes at least a combiner and, typically, second selected exclusive-OR (XOR) logic gates, each such gate for comparing one of: selected processed predetermined first selectively delayed bits and latched selected processed predetermined first selectively delayed bits with one of predetermined reference input bits and the combiner, typically a NOR gate, for combining processed bits to provide at least a first frame synchronization determination for the received time division multiplexed signal.

Second selected XOR logic gates are typically successively operably coupled to sequential selected series of latches to process the predetermined number of selected sequential latched selected processed predetermined first selectively delayed bits together with selected predetermined reference input bits to provide second XOR serial latch logic gate outputs One second XOR logic gate is operably coupled to a desired first XOR output and a selected predetermined reference input bit to process a selected processed predetermined first selectively delayed bit and a selected predetermined reference input bit to provide first-second XOR logic gate output. Further, the combiner is arranged to substantially combine the second XOR serial latch logic gate outputs and the first-second XOR logic gate output to provide a frame synchronization (FRAME SYNC) output (112).

In the exemplary hardware embodiment, FIG. 2, numeral 200, the second logic gating system unit (214) (includes at least a combiner (218) and second selected exclusive-OR (XOR) logic gates (216A, 216B, 216C, 216D), a first such gate (216A) for processing a first selected processed predetermined first selectively delayed bit and a predetermined reference input bit Y1, a second such gate (216B) for processing a second selected processed predetermined first selectively delayed bit and a predetermined reference input bit Y2, a third such gate (216C) for processing a third selected processed predetermined first selectively delayed bit and a predetermined reference input bit Y3, a fourth such gate (216D) for processing a selected processed selected first selectively delayed bit, typically a last such bit obtained, and a predetermined reference input bit Y4, and a combiner (218), for example a NOR gate, for combining processed bits to provide at least a first frame synchronization determination for the received time division multiplexed signal.

The number of combined second XOR serial latch logic gate outputs together with the first-second XOR logic gate output is substantially n−k=m, m being a number of predetermined reference bits and also a size of a cyclic redundancy check bit segment.

The embodiment illustrated in FIG. 2, setting forth an implementation with the moderately shortened CRC code such that $n_o>n$ and $n_o-n<m$, is further described by reference to the fourth embodiment of of a CRC digital receiver frame synchronization determining system, FIG. 6, numeral 600, of a time division multiplexed signal in accordance with the present invention, further described below. FIG. 4, numeral 400, provides a second embodiment of a CRC digital receiver frame synchronization determining system of a time division multiplexed signal in accordance with the present invention wherein a CRC code is shortened such that $n_o>n$. When the CRC code is not shortened, a code segment size n is substantially equal to a natural length $n_o$ of the CRC code, and the second multiple delay system unit may be simplified, FIG. 3, numeral 300. A CRC frame synchronization system with a generating polynomial $g(x)=x^4+x+1$ and a four bit CRC code, FIG. 7, numeral 700, and a similar system for an unshortened CRC code, FIG. 5, numeral 500, are described below.

Figure 3:
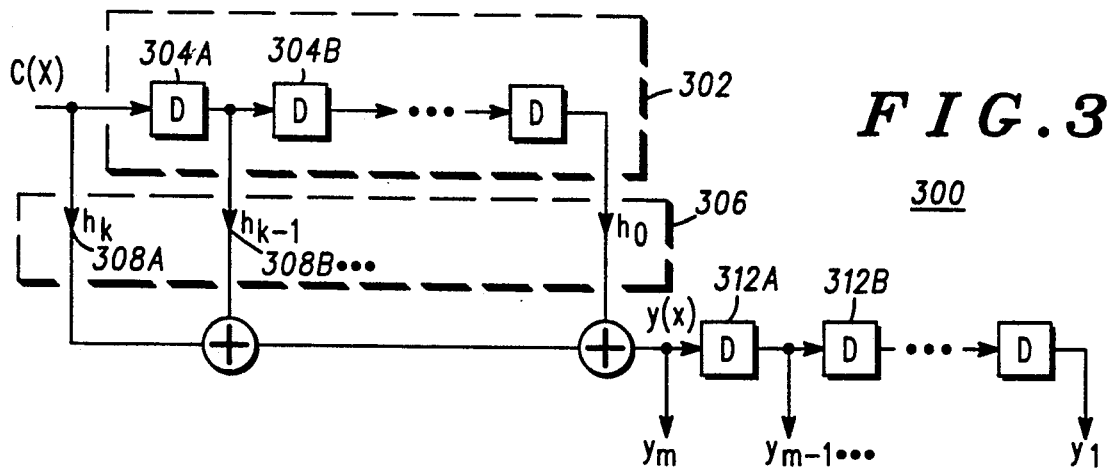
FIG. 3 illustrates a first embodiment of a CRC digital receiver frame synchronization determining system (second logic gating system unit not shown) of a time division multiplexed signal in accordance with the present invention.
Figure 4:
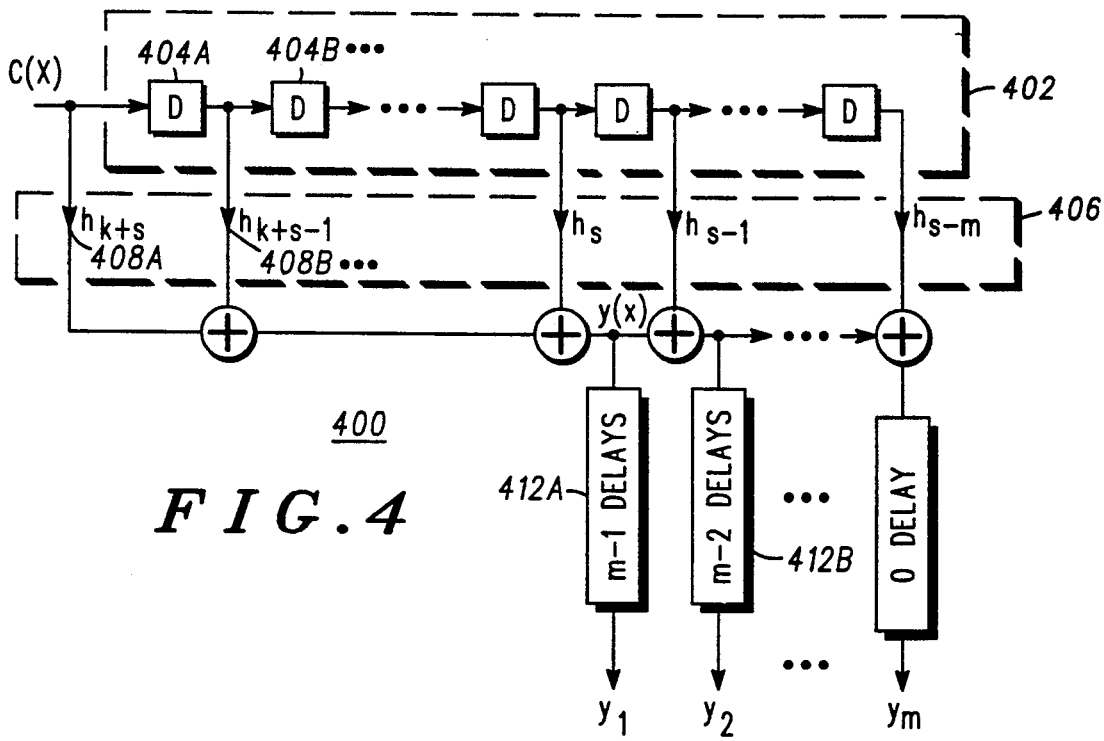
FIG. 4 illustrates a second embodiment of a CRC digital receiver frame synchronization determining system (second logic gating system unit not shown) of a time division multiplexed signal in accordance with the present invention.
Figure 5:
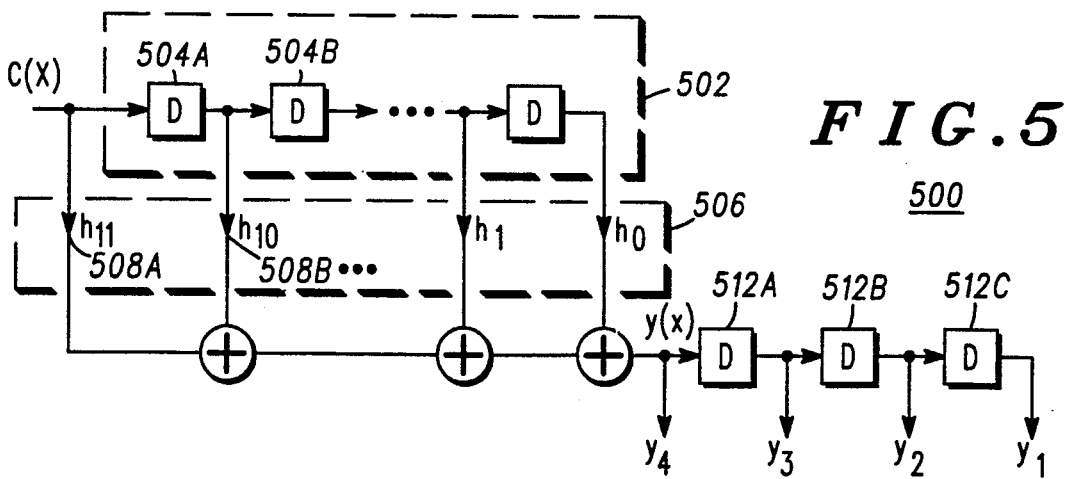
FIG. 5 illustrates a third embodiment of a CRC digital receiver frame synchronization determining system (second logic gating system unit not shown) of a time division multiplexed signal in accordance with the present invention.

Similarly to the system utilized above for CRC frame synchronization determination utilizing a moderately shortened CRC code, FIG. 2, a system may be utilized for a natural length $n_o$ of the CRC code as set forth in FIG. 3, numeral 300, and FIG. 5, numeral 500. Such a system may be utilized for a predetermined number of first selectively delayed bits, being a predetermined selected bit length $n_o$, such that a number of first selectively delayed bits, a first $k+1$ bits, are shifted into the delay circuit, and are processed in accordance with a predetermined logic, the number being substantially $k+1$, where k is substantially also a degree of a parity check polynomial $h(x)$; the predetermined number of second selectively delayed bits is substantially $m-1$; and the number of combined second XOR serial latch logic gate outputs together with the first-second XOR logic gate output is substantially $n_o-k=m$, m being a number of predetermined reference bits and also a size of a cyclic redundancy check bit segment. Hardware implementation of such embodiment of the present invention, not illustrated, but described by systems in FIGS. 5 and 3, provides selected tapped outputs of a FIR filter, substantially a first multiple delay system unit and a first logic gating system unit, (302 and 306, 502, and 506) to a sequential series of delay units (312A, 312B, ...)(512A, 512B, ...) where the delay units provide a range of $m-1$ delays to zero delays, thus providing a series of outputs (y1, ..., ym) that, when compared to a predetermined coefficient pattern designation, may be utilized to provide a frame synchronization determination.

The present invention may be embodied (not illustrated) wherein at least one of:
the at least first multiple delay system means;
the at least first logic gating system means;
the at least second multiple delay system means; and
the at least second logic gating system;
is implemented utilizing a computer program storage medium having a computer program to be executed by a digital computer stored thereon. The computer program comprises a first unit for processing a received time division multiplexed signal, the signal including at least a first fixed length data bit segment followed by a cyclic redundancy check bit segment; and a second unit for generating a frame synchronization output for each at least first fixed length data bit segment followed by a cyclic redundancy check bit segment. The first unit for processing includes:

for implementing a first multiple delay system means, a third unit for generating values for first selectively delayed bits;

for implementing a first logic gating system means, a fourth unit for processing values of selected first selectively delayed bits in accordance with an XOR logic;

for implementing a second multiple delay system means, a fifth unit for generating values for second selectively delayed bits; and for implementing a second logic gating system means, a sixth unit for processing values for a predetermined number of selected second selectively delayed bits, selected processed selected first selectively delayed bits, and predetermined reference input bits in accordance with XOR logic to obtain sixth processed values; and for implementing combining sixth processed values, a seventh unit to provide at least a first frame synchronization determination for the received time division multiplexed signal.

Clearly, an embodiment of The non-feedback cyclic redundancy checking device of the present invention may be in a digital radio receiver framing synchronization determination unit, implemented in accordance with the description above.

FIG. 3, numeral 300, illustrates a first embodiment of a CRC digital receiver frame synchronization determining system of a time division multiplexed signal in accordance with the present invention wherein an unshortened natural length $n_o$ cyclic CRC code is utilized. An input $c(x)$ is applied to a FIR filter (302 and 306), being the first multiple delay system unit (102) and the first logic gating system unit (104), illustrated by a predetermined number of delay units (304A, 304B, ...) each operably connected to one of gain factor units (308A, 308B, ...). The output of the FIR filter (302 and 306) is applied to a further series of delay units (312A, 312B, ...), and a tapped delay line of that series of delay units provides a series of outputs (y1, ..., ym) that, when compared to predetermined reference input bits, may be utilized to provide a frame synchronization determination.

FIG. 4, numeral 400, illustrates a second embodiment of a CRC digital receiver frame synchronization determining system of a time division multiplexed signal in accordance with the present invention wherein a shortened cyclic code, $s=n_o-n>0$, is utilized. An input $c(x)$ is applied to a FIR filter (402 and 406), being the first multiple delay system unit (102) and the first logic gating system unit (104), illustrated by a predetermined number of delay units (404A, 304B, ...) each operably connected to one of gain factor units (408A, 408B, ...). Selected tapped outputs of the FIR filter (402 and 406) are applied to a sequential series of delay units (412A, 412B, ...), where the delay units provide a range of $m-1$ delays to zero delays, thus providing a series of outputs (y1, ..., ym) that, when compared to predetermined reference input bits, may be utilized to provide a frame synchronization determination.

FIG. 5, numeral 500, illustrates a third embodiment of a CRC digital receiver frame synchronization determining system of a time division multiplexed signal in accordance with the present invention, wherein n is substantially 15 and k is substantially 11 for the cyclic code. An input $c(x)$ is applied to a FIR filter (502 and 506), being the first multiple delay system unit (102) and the first logic gating system unit (104), illustrated by 11 delay units, , (504A, 504B, ...) each operably connected to one of 12 gain factor units, $h_o-h_{11}$, (508A, 508B, ...). The output of the FIR filter (502 and 506) is applied to a further series of 3 delay units (512A, 512B, 512C), and a tapped delay line of that series of delay units provides a series of outputs (y1, y2, y3, y4) that, when compared to predetermined reference input bits, may be utilized to provide a frame synchronization determination.

Figure 6:
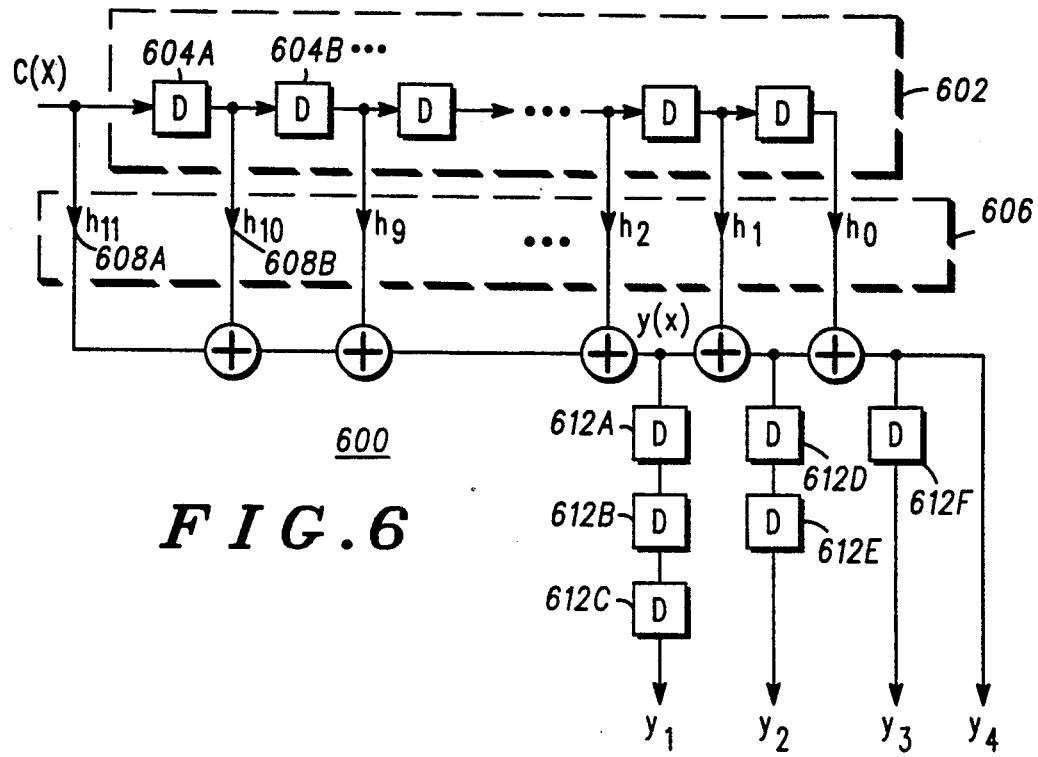
FIG. 6 illustrates a fourth embodiment of a CRC digital receiver frame synchronization determining system (second logic gating system unit not shown) of a time division multiplexed signal in accordance with the present invention.

FIG. 6, numeral 600, illustrates a fourth embodiment of of a CRC digital receiver frame synchronization determining system of a time division multiplexed signal in accordance with the present invention, wherein n is substantially 13 and k is substantially 9 for the cyclic code. An input $c(x)$ is applied to a FIR filter (602 and 606), being the first multiple delay system unit (102) and the first logic gating system unit (104), illustrated by 11 delay units (604A, 604B, ...) each operably connected to one of 12 gain factor units, $h_o$–$h_{11}$, (608A, 608, ...). Selected tapped outputs of the FIR filter (602 and 606) are applied sequentially to a series of delay units (612A, 612B, ...), where the delay units provide 3 delays (612A, 612B, 612C), 2 delays (612D, 612E), 1 delay (612F), and zero delay to the sequential tapped output of the series of delay units, thus providing a series of outputs ($y_1$, $y_2$, $y_3$, $y_4$) that, when compared to predetermined reference input bits, may be utilized to provide a frame synchronization determination.

Figure 7:
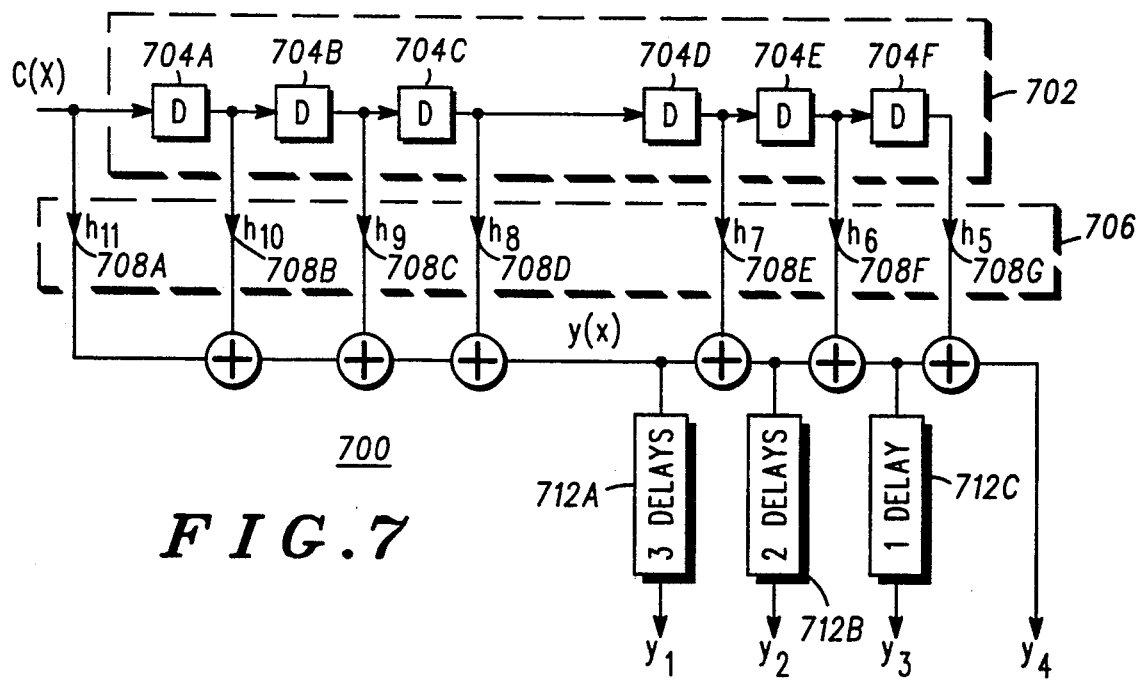
FIG. 7 illustrates a fifth embodiment of a CRC digital receiver frame synchronization determining system (second logic gating system unit not shown) of a time division multiplexed signal in accordance with the present invention.

FIG. 7, numeral 700, illustrates a fifth embodiment of of a CRC digital receiver frame synchronization determining system of a time division multiplexed signal in accordance with the present invention, utilizing a (7,3) shortened cyclic code. An input c(x) is applied to a FIR filter (702 and 706), being the first multiple delay system unit (102) and the first logic gating system unit (104), illustrated by a predetermined number of delay units (704A, 704B, ..., 704F) each operably connected to one of gain factor units (708A, 708B, ..., 708G). Gain factor inputs typically include, separately, a tap before each delay (708A, 708B, ..., 708F) and a last tap after a last delay (708G), the inputs being multiplied by respective gain factors. Selected tapped delayed (704C, 704D, 704E, 704F) outputs, multiplied by respective gain factors ($h_8$, $h_7$, $h_6$, $h_5$) are typically tapped following each of a last four delays of the first multiple delay system and multiplied by gain factors, are applied sequentially to a series of delay units (712A, 712B, 712C), where the delay units provide a range of m−1 delays to zero delays, in the present embodiment being a series of 3 delays (712A), a series of 2 delays (712B, one delay (712C), and the tap following the last delay of the first multiple delay system being directly provided, to provide a series of outputs ($y_1$, $y_2$, $y_3$, $y_4$) that, when compared to predetermined reference input bits, may be utilized to provide a frame synchronization determination.

Figure 8:
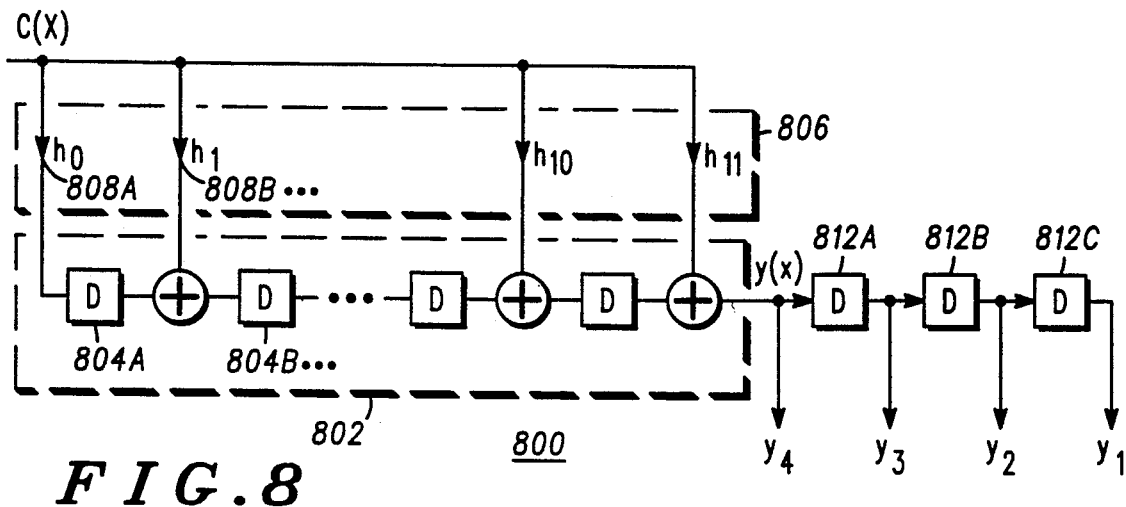
FIG. 8 illustrates a sixth embodiment of a CRC digital receiver frame synchronization determining system (second logic gating system unit not shown) of a time division multiplexed signal in accordance with the present invention.

FIG. 8, numeral 800, illustrates a sixth embodiment of of a CRC digital receiver frame synchronization determining system (second logic gating system unit not shown) of a time division multiplexed signal in accordance with the present invention, utilizing a (15,11) cyclic code wherein the finite impulse response filter is transposed. An input c(x) is applied to a FIR filter (806 and 802), being the first logic gating system unit (104) and the first multiple delay system unit (102), illustrated by 12 gain factor units, $h_o$–$h_{11}$, (808A, 808B, ...) each operably connected to one of 11 delay units (804A, 804B, ...). The output of the FIR filter (802 and 806) is applied to a further series of 3 delay units (812A, 812B, 812C), being the second multiple delay unit (108), to provide a series of outputs ($y_1$, $y_2$, $y_3$, $y_4$) that, when compared to predetermined reference input bits, may be utilized to provide a frame synchronization determination.

Figure 9:
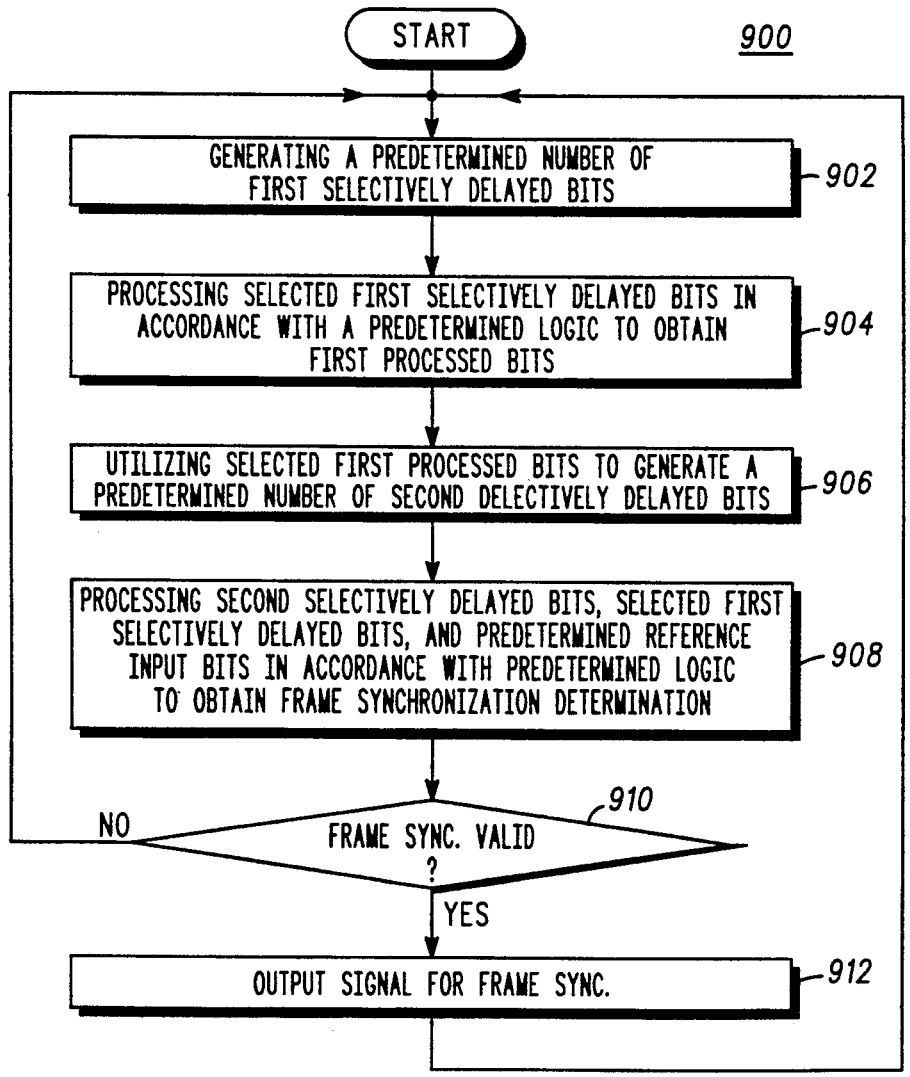
FIG. 9 is a flow diagram of a method for determining a CRC for a digital receiver frame synchronization determination of a time division multiplexed signal in accordance with the present invention.

FIG. 9, numeral 900, sets forth a flow diagram of a method of determining a non-feedback CRC for a digital receiver framing synchronization determination of a time division multiplexed signal in accordance with the present invention. The non-feedback cyclic redundancy checking method for generating a digital receiver framing synchronization determination of a received time division multiplexed signal having bits, comprises at least the steps of: generating a predetermined number of first selectively delayed bits of the received time division multiplexed signal in accordance with a timing unit (902); processing selected first selectively delayed bits in accordance with a predetermined logic to obtain first processed bits (904); utilizing selected first processed bits to generate a predetermined number of second selectively delayed bits (906); and processing second selectively delayed bits, selected first selectively delayed bits, predetermined reference input bits in accordance with the predetermined logic to determine a frame synchronization (frame sync) (908), determining whether the frame sync is valid (910), recycling to generating a predetermined number of first selectively delayed bits of the received time division multiplexed signal in accordance with a timing unit (902) where the frame sync is not valid (N), and, where the frame sync is valid (Y), outputting a signal indicating frame synchronization (OUTPUT SIGNAL FOR FRAME SYNC)(912) and recycling to generating a predetermined number of first selectively delayed bits of the received time division multiplexed signal in accordance with a timing unit (902). This recycling is repeated to find out all possible first synchronization determinations.

Generating first selectively delayed bits of the received time division multiplexed signal in accordance with a timing unit includes utilizing at least a substantially uniform first multiple delay unit responsive to the bits of the received time division multiplexed signal and to a timing device wherein the substantially uniform first multiple delay unit includes at least selected flip-flops for latching desired bit information.

As set forth for the device of the present invention, selected first selectively delayed bits are processed in accordance with a predetermined logic to obtain first processed bits includes utilizing at least first selected exclusive-OR (XOR) logic gates for processing predetermined first selectively delayed bits in accordance with XOR logic. Also, selected first processed bits are utilized to generate second selectively delayed bits includes utilizing at least selected flip-flop delay systems for latching, as desired selected processed predetermined first selectively delayed bits in accordance with XOR logic.

Processing second selectively delayed bits, selected first selectively delayed bits, and predetermined reference input bits in accordance with the predetermined logic includes utilizing at least a combiner and second selected exclusive-OR (XOR) logic gates, each such gate for processing two of: selected processed predetermined first selectively delayed bits, latched selected processed predetermined first selectively delayed bits, and predetermined reference input bits in accordance with XOR logic and combining processed bits to provide at least a first frame synchronization determination for the received time division multiplexed signal.

The steps further include: processing the predetermined number of selected sequential latched selected processed predetermined first selectively delayed bits together with selected predetermined reference input bits to provide second XOR serial latch logic gate outputs, and processing a selected processed predetermined first selectively delayed bit and a selected predetermined reference input bit to provide first-second XOR logic gate output; and combining the second XOR serial latch logic gate outputs and the first-second XOR logic gate output to provide a frame sequence determination.

As implemented for the device, for a predetermined number of first selectively delayed bits, being n when $n \leq n_o - m$, and $k+1$ when $n > n_o - m$;

(1) a number of first selectively delayed bits for processing in accordance with a predetermined logic is substantially n when $n \leq n_o - m$, and $k+1$ when $n > n_o - m$;

(2) the predetermined number of second selectively delayed bits is substantially $m-1$; and (3) the number of combined second XOR serial latch logic gate outputs together with the first-second XOR logic gate output is substantially $n-k=m$, m being a number of predetermined reference bits and also a size of a cyclic redundancy check bit segment.

Also the method of the present invention may be embodied wherein at least one of: generating a predetermined number of first selectively delayed bits of the received time division multiplexed signal in accordance with a timing unit (902); processing selected first selectively delayed bits in accordance with a predetermined logic to obtain first processed bits (904); utilizing selected first processed bits to generate a predetermined number of second selectively delayed bits (906); and processing second selectively delayed bits, selected first selectively delayed bits, and predetermined reference input bits in accordance with the predetermined logic(908); is implemented utilizing a computer program storage medium having a computer program to be executed by a digital computer stored thereon, the computer program utilizing the steps of:

processing a received time division multiplexed signal, the signal including at least a first fixed length data bit segment followed by a cyclic redundancy check bit segment; and generating frame synchronization outputs for each at least first fixed length data bit segment followed by a cyclic redundancy check bit segment.

The received time division multiplexed signal typically includes at least a first fixed length data bit segment followed by a cyclic redundancy check bit segment.

The computer program substantially includes the steps of: for implementing a first multiple delay system means, generating values for first selectively delayed bits; for implementing a first logic gating system means, processing values of selected first selectively delayed bits in accordance with an XOR logic; for implementing a second multiple delay system means, generating values for second selectively delayed bits; and for implementing a second logic gating system means, processing values for a predetermined number of selected second selectively delayed bits, selected processed selected first selectively delayed bits, and predetermined reference input bits in accordance with XOR logic to obtain sixth processed values and combining sixth processed values to provide at least a first frame synchronization determination for the received time division multiplexed signal.

A CRC code is usually described by its generating polynomial g(x). The following sections describe how to determine a parity check polynomial h(x) from a generating polynomial g(x).

For a cyclic or shortened cyclic (n,k) code, the generating polynomial g(x) has a degree $m = n-k$. For any polynomial g(x) of degree over any finite field, there is a minimum integer $n_o$ such that g(x) is a factor of $x^{n_o}-1$, such that there exists a polynomial h(x) of degree $n_o - m$ such that $g(x)h(x) = x^{n_o} - 1$. A maximum number for such a $n_o$ is $q^m - 1$, where q is a size of a finite field g(x) is based on. For a binary finite field, the maximum number for $n_o$ is $2^m - 1$. This $n_o$ is called the natural length of the CRC code.

A convenient way to generate h(x) is to use g(x) to make a feedback shift register that performs a multiply by x modulo g(x) operation. Initially, all stages except a last stage of the feedback shift register are set to zero, the last stage being set to one. The feedback register is allowed to run until it returns to its initial value, and outputs obtained provide polynomial coefficients for h(x).

For the exemplary implementation described in the preferred embodiment, FIG. 2, a binary CRC code with generating polynomial $g(x) = x^4 + x + 1$ is utilized. To obtain the coefficients for h(x), a feedback shift register is set to 0001 such that sequentially, coefficients are:

| | | |
|---|---|---|
| 0 | 0001 | 0 |
| 1 | 0010 | 0 |
| 2 | 0100 | 0 |
| 3 | 1000 | 0 |
| 4 | 0011 | 1 |
| 5 | 0110 | 0 |
| 6 | 1100 | 0 |
| 7 | 1011 | 1 |
| 8 | 0101 | 1 |
| 9 | 1010 | 0 |
| 10 | 0111 | 1 |
| 11 | 1110 | 0 |
| 12 | 1111 | 1 |
| 13 | 1101 | 1 |
| 14 | 1001 | 1 |
| 15 | 0001 | 1 |

This yields $h(x) = x^{11} + x^8 + x^7 + x^5 + x^3 + x^2 + x + 1$.

A parity check matrix for this code is:

$$H = \begin{array}{c} 0\,0\,0\,1 \\ 0\,0\,1\,1 \\ 0\,1\,1\,1 \\ 1\,1\,1\,1 \\ 1\,1\,1\,0 \\ 1\,1\,0\,1 \\ 1\,0\,1\,0 \\ 0\,1\,0\,1 \\ 1\,0\,1\,1 \\ 0\,1\,1\,0 \\ 1\,1\,0\,0 \\ 1\,0\,0\,1 \\ 0\,0\,1\,0 \\ 0\,1\,0\,0 \\ 1\,0\,0\,0 \end{array}$$

This code can be implemented in a structure, a system for which is set forth in FIG. 5. Shortening this code to a (13,9) code by removing a top two rows of the parity check matrix H provides a shortened CRC code used in the exemplary implementation, FIG. 2, also illustrated in the system set forth in FIG. 6. Further shortening of this code to a (7,3) code by removing a total of eight top rows of the parity check matrix provides a CRC code system illustrated in FIG. 7.

The reference bits $Y_1, \ldots, Y_m$ are normally zeros for a CRC generated by taking a remainder of a data stream modulo g(x). Quite often, the CRC is modified to obtain other desired properties not particularly related to the present invention. All such CRC modifications normally encountered in a digital network, including but not limited to inverting a polarity of code bits, starting an initial state of a CRC generator to all-one and the like, may be regarded as adding a constant vector to an otherwise normally generated CRC, and reference bits may be determined by multiplying that constant vector with the parity check matrix H. For example, for the (7,3) code, inverting all bits is equivalent to adding an all-one vector to a code vector. The parity from the all-one vector is:

$$(1\ 1\ 1\ 1\ 1\ 1\ 1)\ H = (0\ 1\ 1\ 0) = (Y_4\ Y_3\ Y_2\ Y_1).$$

Thus, instead of declaring a coded segment on $(y_4\ y_3\ y_2\ y_1) = (0\ 0\ 0\ 0)$, it will be done when $(y_4\ y_3\ y_2\ y_1) = (0\ 1\ 1\ 0)$.

Thus, in the above example, a false alarm rate on a random bit stream will be $2^{-4}$ in accordance with the generator polynomial $g(x)$ of degree 4. Generally, the false alarm rate on a random bit stream will be $2^{-m}$ for an m-bit CRC code.

Although an exemplary embodiment is described above, it will be obvious to those skilled in the art that many alterations and modifications may be made without departing from the invention. Such modifications may include using a transposed form for the FIR filter, multiple such device units, and combinations of these modifications to gain speed and other advantages. Accordingly, it is intended that all such alterations and modifications be included within the spirit and scope of the invention as defined in the appended claims.

The present invention utilized with a suitable framing circuit significantly reduces the time required for digital receiver frame synchronization determinations, and thus allows for more efficient digital network communications.

I claim:

1. A non-feedback cyclic redundancy checking (CRC) device for a digital receiver framing synchronization determination of a received time division multiplexed signal having bits, comprising at least:
   (A) first multiple delay system means responsive to the bits of the received time division multiplexed signal and a timing means for generating a predetermined number of first selectively delayed bits;
   (B) first logic gating system means responsive to at least the first selectively delayed bits for processing selected first selectively delayed bits in accordance with a predetermined logic;
   (C) second multiple delay system means responsive to the processed selected first selectively delayed bits for generating a predetermined number of second selectively delayed bits; and
   (D) second logic gating system means responsive to at least some of: selected second selectively delayed bits, selected processed first selectively delayed bits, predetermined reference input bits, and the timing means for processing second selectively delayed bits, selected processed selected first selectively delayed bits, and predetermined reference input bits in accordance with the predetermined logic; wherein the above means are configured to provide at least a first frame synchronization determination for the received time division multiplexed signal, wherein,
   for a predetermined number of first selectively delayed bits, being n when $n \leq n_o - m$, and $k+1$ when $n > n_o - m$, k being a length of a data segment in a code segment, and $n_o$ being a natural length of a CRC code such that $n_o \geq n$.

(1) a number of first selectively delayed bits for processing in accordance with a predetermined logic is substantially n, when $n > n_o - m$, and $k+1$ when $n > n_o - m$;
   (2) the predetermined number of second selectively delayed bits is substantially $m - 1$; and
   (3) the number of combined second XOR serial latch logic gate outputs together with the first-second XOR logic gate output is substantially $n - k = m$, m being a number of predetermined reference bits and also a size of a cyclic redundancy check bit segment.

2. The non-feedback cyclic redundancy checking device of claim 1 wherein the first multiple delay system means includes at least a first substantially uniform multiple delay circuit responsive to the bits of the received time division multiplexed signal and to a timing device.

3. The non-feedback cyclic redundancy checking device of claim 1 wherein the substantially uniform first multiple delay circuit is tapped off after predetermined delays to selected flip-flops for latching desired bit information.

4. The non-feedback cyclic redundancy checking device of claim 1 wherein the first logic gating system means includes at least first selected exclusive-OR (XOR) logic gates for processing predetermined first selectively delayed bits in accordance with XOR logic.

5. The non-feedback cyclic redundancy checking device of claim 1 wherein the signal further includes at least a fixed length data bit segment followed by a cyclic redundancy check bit segment.

6. The non-feedback cyclic redundancy checking device of claim 1 wherein the second multiple delay system means includes at least selected flip-flop delay systems for latching, as desired, selected processed predetermined first selectively delayed bits in accordance with XOR logic.

7. The non-feedback cyclic redundancy checking device of claim 6 wherein the selected flip-flop systems for latching comprise, in parallel, a selected series of serially operably connected latches, a number of serially connected latches being substantially equal to a desired number of delays and the number of delays for each sequential selected series being sequentially selected from a range of delays from a desired largest number of delays to zero delays.

8. The non-feedback cyclic redundancy checking device of claim 1 wherein the second logic gating system means includes at least a combiner and second selected exclusive-OR (XOR) logic gates, each such gate for processing two of: selected processed predetermined first selectively delayed bits, latched selected processed predetermined first selectively delayed bits, and predetermined reference input bits in accordance with XOR logic and combining processed bits to provide at least a first frame synchronization determination for the received time division multiplexed signal.

9. The non-feedback cyclic redundancy checking device of claim 8 wherein:
   second selected XOR logic gates are successively operably coupled to sequential selected series of latches to process the predetermined number of selected sequential latched selected processed predetermined first selectively delayed bits together with selected predetermined reference input bits to provide second XOR serial latch logic gate outputs, and one second XOR logic gate is operably coupled to a desired first XOR output and a selected predetermined reference input bit to process a selected processed predetermined first selectively delayed bit and a selected predetermined reference input bit to provide first-second XOR logic gate output; and the combiner is arranged to substantially combine the second XOR serial latch logic gate outputs and the first-second XOR logic gate output to provide a frame sequence determination.

10. A non-feedback cyclic redundancy checking device for a digital radio receiver framing synchronization determination of a received time division multiplexed signal having bits, comprising at least:

(A) first multiple delay system means responsive to the bits of the received time division multiplexed signal and a timing means for generating a predetermined number of first selectively delayed bits, wherein the first multiple delay system means includes at least a first substantially uniform first multiple delay circuit responsive to the bits of the received time division multiplexed signal and to a timing means;

(B) first logic gating system means responsive to at least the first selectively delayed bits for processing selected first selectively delayed bits in accordance with a predetermined logic, wherein the first logic gating system means includes at least first selected exclusive-OR (XOR) logic gates for processing predetermined first selectively delayed bits in accordance with XOR logic;

(C) second multiple delay system means responsive to the processed selected first selectively delayed bits for generating a predetermined number of second selectively delayed bits; and (D) second logic gating system means responsive to at least some of: selected second selectively delayed bits, selected processed first selectively delayed bits, predetermined reference input bits, and the timing means for processing second selectively delayed bits, selected processed selected first selectively delayed bits, and predetermined reference input bits in accordance with the predetermined logic; wherein the above means are configured to provide at least a first frame synchronization determination for the received time division multiplexed signal, wherein for a predetermined number of first selectively delayed bits, being n when $n \leq n_o - m$, and $k+1$ when $n > n_o - m$, k being a length of a data segment in a code segment, and $n_o$ being a natural length of a CRC code such that $n_o \geq n$.

(1) a number of first selectively delayed bits for processing in accordance with a predetermined logic is substantially n when $n \leq n_o - m$, and $k+1$ when $n > n_o - m$;

(2) the predetermined number of second selectively delayed bits is substantially $m - 1$; and (3) the number of combined second XOR serial latch logic gate outputs together with the first-second XOR logic gate output is substantially $n - k = m$, m being a number of predetermined reference bits and also a size of a cyclic redundancy check bit segment.

11. The non-feedback cyclic redundancy checking device of claim 10 wherein the substantially uniform first multiple delay circuit includes at least selected flip-flops for latching bit information.

12. The non-feedback cyclic redundancy checking device of claim 10 wherein the second multiple delay system means includes at least selected flip-flop delay systems for latching, as desired, selected processed predetermined first selectively delayed bits in accordance with XOR logic.

13. The non-feedback cyclic redundancy checking device of claim 10 wherein the signal further includes at least a fixed length data bit segment followed by a cyclic redundancy check bit segment.

14. The non-feedback cyclic redundancy checking device of claim 10 wherein the second logic gating system means includes at least a combiner and second selected exclusive-OR (XOR) logic gates, each such gate for processing two of: selected processed predetermined first selectively delayed bits, latched selected processed predetermined first selectively delayed bits, and predetermined reference input bits in accordance with XOR logic and combining processed bits to provide at least a first frame synchronization determination for the received time division multiplexed signal.

15. The non-feedback cyclic redundancy checking device of claim 14 wherein:

second selected XOR logic gates are successively operably coupled to sequential selected series of latches to process the predetermined number of selected sequential latched selected processed predetermined first selectively delayed bits together with selected predetermined reference input bits to provide second XOR serial latch logic gate outputs, and one second XOR logic gate is operably coupled to a desired first XOR output and a selected predetermined reference input bit to process a selected processed predetermined first selectively delayed bit and a selected predetermined reference input bit to provide first-second XOR logic gate output; and the combiner is arranged to substantially combine the second XOR serial latch logic gate outputs and the first-second XOR logic gate output to provide a frame sequence determination.

16. A non-feedback cyclic redundancy checking method for generating a digital receiver framing synchronization determination of a received time division multiplexed signal having bits, comprising at least the steps of:

(A) generating a predetermined number of first selectively delayed bits of the received time division multiplexed signal in accordance with a timing unit;

(B) processing selected first selectively delayed bits in accordance with a predetermined logic to obtain first processed bits;

(C) utilizing selected first processed bits to generate a predetermined number of second selectively delayed bits; and (D) processing second selectively delayed bits, selected first selectively delayed bits, and predetermined reference input bits in accordance with the predetermined logic, wherein, for a predetermined number of first selectively delayed bits, being n when $n \leq n_o - m$, and $k+1$ when $n > n_o - m$, k being a length of a data segment in a code segment, and $n_o$ being a natural length of a CRC code such that $n_o \geq n$, (1) a number of first selectively delayed bits for processing in accordance with a predetermined logic is substantially n when $n \leq n_o - m$, and $k+1$ when $n > n_o - m$;

(2) the predetermined number of second selectively delayed bits is substantially $m-1$; and (3) the number of combined second XOR serial latch logic gate outputs together with the first-second XOR logic gate output is substantially $n - k = m$, m being a number of predetermined reference bits and also a size of a cyclic redundancy check bit segment.

17. The non-feedback cyclic redundancy checking method of claim 16 wherein generating first selectively delayed bits of the received time division multiplexed signal in accordance with a timing unit includes utilizing at least a substantially uniform first multiple delay circuit responsive to the bits of the received time division multiplexed signal and to a timing device.

18. The non-feedback cyclic redundancy checking method of claim 16 wherein the substantially uniform first multiple delay circuit includes at least selected flip-flops for latching desired bit information.

19. The non-feedback cyclic redundancy checking method of claim 16 wherein processing selected first selectively delayed bits in accordance with a predetermined logic to obtain first processed bits includes utilizing at least first selected exclusive-OR (XOR) logic gates for processing predetermined first selectively delayed bits in accordance with XOR logic.

20. The non-feedback cyclic redundancy checking method of claim 16 wherein utilizing selected first processed bits to generate second selectively delayed bits includes utilizing at least selected flip-flop delay systems for latching, as desired, selected processed predetermined first selectively delayed bits in accordance with XOR logic.

21. The non-feedback cyclic redundancy checking method of claim 16 wherein the signal further includes at least a fixed length data bit segment followed by a cyclic redundancy check bit segment.

22. The non-feedback cyclic redundancy checking method of claim 16 wherein processing second selectively delayed bits, selected first selectively delayed bits, and predetermined reference input bits in accordance with the predetermined logic includes utilizing at least a combiner and second selected exclusive-OR (XOR) logic gates, each such gate for processing two of: selected processed predetermined first selectively delayed bits, latched selected processed predetermined first selectively delayed bits, and predetermined reference input bits in accordance with XOR logic and combining processed bits to provide at least a first frame synchronization determination for the received time division multiplexed signal.

23. The non-feedback cyclic redundancy checking method of claim 22 further including the steps of:

processing the predetermined number of selected sequential latched selected processed predetermined first selectively delayed bits together with selected predetermined reference input bits to provide second XOR serial latch logic gate outputs, and processing a selected processed predetermined first selectively delayed bit and a selected predetermined reference input bit to provide first-second XOR logic gate output; and combining the second XOR serial latch logic gate outputs and the first-second XOR logic gate output to provide a frame sequence determination.

* * * * *

UNITED STATES PATENT AND TRADEMARK OFFICE
CERTIFICATE OF CORRECTION

PATENT NO. : 5,267,249

DATED : Nov. 30, 1993

INVENTOR(S) : Ping Dong

It is certified that error appears in the above-identified patent and that said Letters Patent is hereby corrected as shown below:

At column 12, line 3, "$n > n_o - m$" should be --$n \leq n_o - m$--.

Signed and Sealed this

Thirty-first Day of May, 1994

Attest:

BRUCE LEHMAN

*Attesting Officer* — *Commissioner of Patents and Trademarks*